United States Patent [19]
Gaitan et al.

[11] Patent Number: 6,107,210
[45] Date of Patent: Aug. 22, 2000

[54] MASKLESS METHOD FOR FABRICATING A LOW-LOSS MICROWAVE POWER SENSOR DEVICE

[75] Inventors: Michael Gaitan, North Potomac, Md.; Edwin D. Bowen, Ramona, Calif.; Veljko Milanovic, Washington, D.C.

[73] Assignee: The United States of America as represented by the Secretary of Commerce, Washington, D.C.

[21] Appl. No.: 09/136,524

[22] Filed: Aug. 19, 1998

[51] Int. Cl.$^7$ ...................... H01L 21/302; H01L 21/8238
[52] U.S. Cl. ........................ 438/734; 438/749; 438/234; 438/700; 438/200; 438/199; 438/706
[58] Field of Search ................................ 438/700, 734, 438/749, 243, 383, 424; 216/2, 37, 39, 41, 79, 72, 58, 17

[56] References Cited

U.S. PATENT DOCUMENTS

| | | | |
|---|---|---|---|
| 3,696,294 | 10/1972 | Krupka | 324/105 |
| 5,045,151 | 9/1991 | Edell | 156/647 |
| 5,220,188 | 6/1993 | Higashi et al. | 257/467 |
| 5,220,189 | 6/1993 | Higashi et al. | 257/467 |
| 5,345,213 | 9/1994 | Semanick et al. | 338/34 |
| 5,370,458 | 12/1994 | Goff | 374/122 |
| 5,529,937 | 6/1996 | Zhang et al. | 437/10 |

OTHER PUBLICATIONS

Milanovic et al., "Thermoelectric Power Sensor for Microwave Applications by Commercial CMOS Fabrication", IEEE Electron Device Letters, vol. 18, No. 9, Sep., 1997, pp. 45–452.

Tea et al, "Hybrid Postprocessing Etching for CMOS–Compatible MEMS", J. of MEMS, vol. 6, No. 4, Dec., 1997, pp. 363–372.

Milanovic et al, "Micromachined Microwave Transmission Lines in CMOS Technology", IEEE Trans. Microwave Theory Tech., vol. 45, No. 5, May, 1997.

Milanovic, et al, "Implementation of Thermoelectric Microwave Power Sensors in CMOS Technology".

Milanovic, et al, "Micromachined Coplanar Waveguides in CMOS Technology".

*Primary Examiner*—Charles Bowers
*Assistant Examiner*—Hsien Ming Lee
*Attorney, Agent, or Firm*—McDermott Will & Emery

[57] ABSTRACT

A method for forming a single cavity in a substrate, which may extend approximately the length of a device located on top of the substrate, and device produced thereby. The device has a length and a width, and may extend approximately the length of the substrate. After locating the device on the surface of the substrate, a first etchant is applied through openings on the surface of the substrate. Subsequently, a second etchant is applied through the same openings on the surface of the substrate. As a result, a single cavity is formed beneath the surface of the device, suspending the device and minimizing electrical coupling.

6 Claims, 8 Drawing Sheets

MASKLESS METHOD FOR FABRICATING A LOW-LOSS MICROWAVE POWER SENSOR DEVICE

TECHNICAL FIELD OF THE INVENTION

The present invention relates to micromachined devices which are manufactured by standard foundry fabrication of complementary metal-oxide semiconductor (CMOS) integrated circuits (ICs). More particularly, the invention relates to novel micromachining of the semiconductor substrate in the vicinity of and beneath a device located on the surface of the substrate to permit device operation at significantly increased frequencies and with improved efficiencies.

BACKGROUND

With higher signal frequencies being utilized in communication systems and integrated circuits, there is a great demand for low-cost, miniature microwave components. In many applications, such components must be integrated with analog and digital circuits. Various techniques have been proposed for fabricating microwave components using micromachining techniques. These proposed techniques, however, require many photolithographic masking steps both on the top and bottom surfaces of the wafer for micromachining and metal deposition. The techniques are not compatible with commercially available CAD tools and CMOS foundry capabilities. Consequently, integration of such components with analog and digital circuits using conventional techniques is not possible.

Generally, standard CMOS silicon ICs are not suitable for integration of microwave components due to high losses in silicon at microwave frequencies. The removal of the lossy silicon substrate material in the vicinity of the metal structures, however, significantly improves the insertion loss characteristics, transmission line dispersion characteristics, phase velocity, and impedance control capability. Thus, a class of passive microwave components can be integrated into the CMOS integrated circuits. Further, the structures are fully compatible with commercial CAD tools, fabrication using commercial CMOS foundry services or the MOSIS services, and micromachined with no additional photolithographic steps.

For these reasons, it is of interest to remove the silicon substrate from directly beneath the thermal and microwave structures to improve the above-described characteristics, while still allowing the monolithic integration of CMOS electronics and overall low-cost fabrication sensors.

Figure 1:
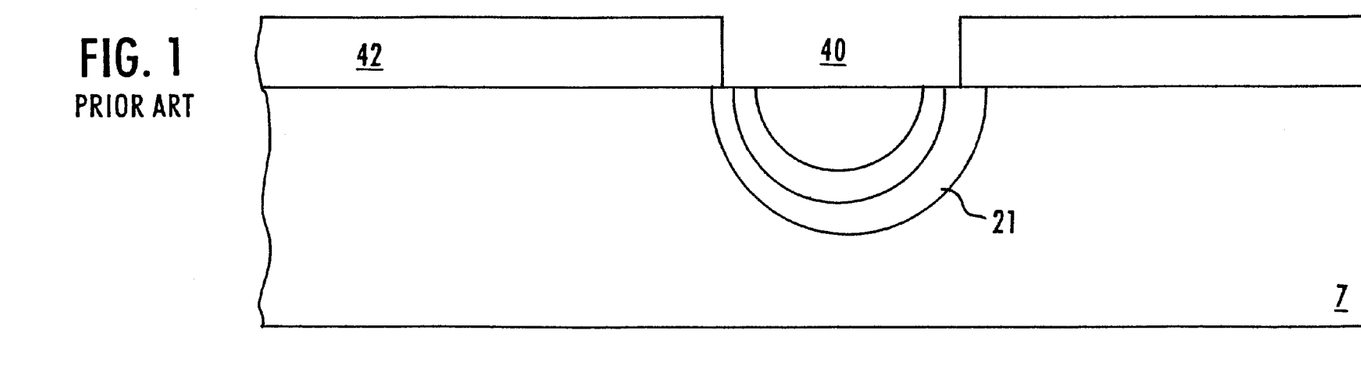
FIG. 1 is a diagram showing the result of etching a substrate using an isotropic etchant through a single opening in the substrate thin film in accordance with the prior art.

FIG. 1 is a cross-sectional view showing the result of an isotropic etching through one opening in a thin film layer covering a substrate. Substrate 7, for example a silicon substrate, includes thin film 42, opening 40, and cavity 21. During isotropic etching, a gaseous etchant, such as xenon difluoride ($XeF_2$), is typically used to create a cavity 21 directly underneath the opening 40 which propagates outward radially. Thin film 42, covering the top of silicon substrate 7, acts as an etch resistant mask protecting the uncovered portion of silicon substrate 7. However, one problem that exists with this method of etching is that all cavities formed are hemispherical in shape. This places constraints on device designs that result in the prevention of fabrication of the desired device structures.

Figure 2:
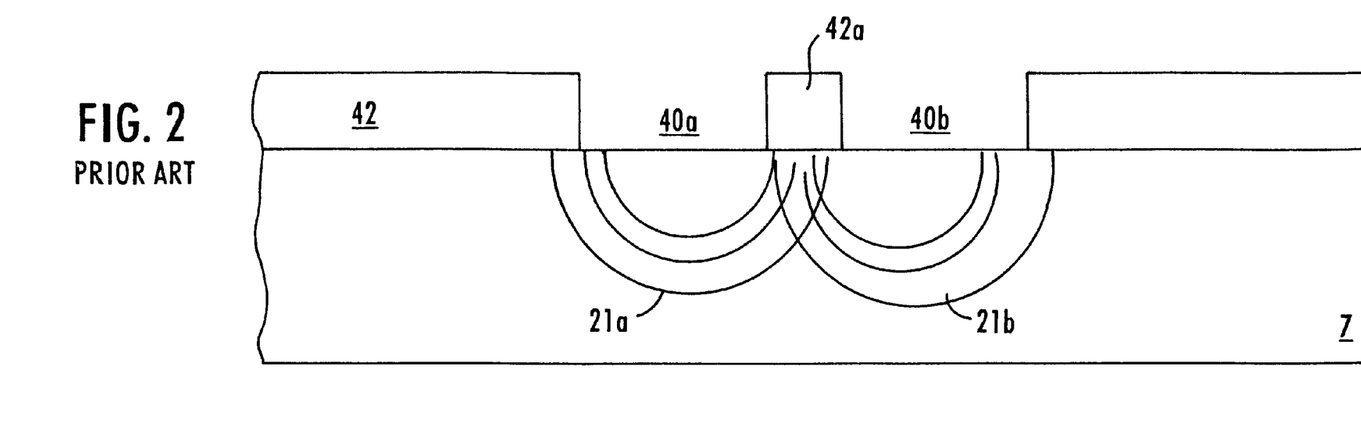
FIG. 2 depicts the result of etching a substrate using an isotropic etchant through multiple openings in the substrate thin film in accordance with the prior art.

FIG. 2 is a cross-sectional view showing the result of isotropic etching through multiple openings in a thin film layer covering a substrate. Substrate 7, for example a silicon substrate, includes thin film portions 42 and 42a, openings 40a and 40b, and cavities 21a and 21b. Similarly, an isotropic etchant, such as xenon difluoride ($XeF_2$), is used to create multiple cavities 21a and 21b directly underneath the multiple openings 40a and 40b, wherein the cavities propagate outward radially. If etching continues long enough, cavities 21a and 21b eventually merge, forming a single cavity 21 which suspends a portion 42a of film 42. Thus, a device may be suspended above merged cavities 21a and 21b. One problem with this solution is that the suspended portion is limited in size. Additionally, limitations are placed on device layouts, and the bottom of the cavity is not entirely flat.

Figure 3:
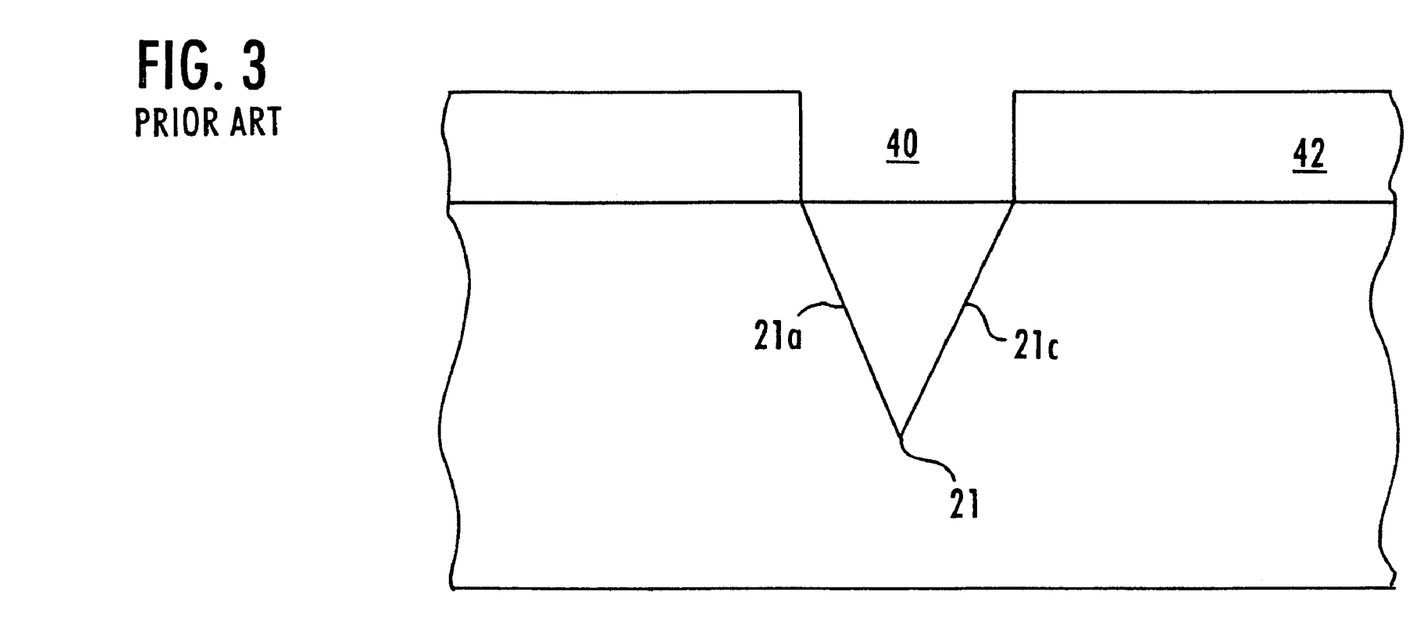
FIG. 3 shows the result of etching a substrate using an anisotropic etchant through a single opening in the substrate thin film in accordance with the prior art.

FIG. 3 is a cross-sectional view showing the result of etching using an anisotropic etchant through an opening in a masking thin film layer covering a substrate. Substrate 7, for example a silicon substrate, includes etch resistant masking thin film 42, opening 40, and V-shaped cavity 21. An anisotropic etchant, such as ethylene diamine-pyrocatechol-water (EDP), is used to create a V-shaped cavity 21 directly underneath opening 40. The anisotropic etch follows the crystalline structure of the <100> wafer, for example, wherein side walls 21c and 21d of V-shaped cavity 21 are typically at a slope of 54.7 degrees from the surface plane (i.e. film 42) and are aligned to the <111> crystallographic plane of substrate 7. Similarly, a problem with this method is that the suspended portion is limited in size.

SUMMARY OF THE INVENTION

In accordance with the present invention, an apparatus and method are provided for forming a single cavity in a substrate, which may extend approximately the length of a device located on the top surface of the substrate. The present invention enables the formation of more arbitrary device structures by utilizing the advantages of isotropic and anisotropic etch processes, while mitigating their disadvantages. The cavity may be formed beneath a device having a length and a width, and may extend almost the full length of the substrate. According to the invention., after locating the device on the surface of the substrate, a first etchant is applied through one or more openings in the surface of the substrate. Subsequently, a second etchant is applied through the same opening(s) in the surface of the substrate. As a result, a single cavity is formed beneath the device, thereby suspending the device and minimizing electrical coupling.

The device may be located on the top surface of the substrate. For example, the device could be a coplanar waveguide having two ground conductors which are coplanar and spaced apart from one another, so as to extend in parallel across the substrate in the same direction. A signal conductor, which is coplanar with the ground conductors, may be located between and spaced apart from the ground conductors, to receive a power signal.

In accordance with aspects of the invention, openings are designed in the top surface of the substrate and extend in parallel along the length of the device along the outer perimeter of the ground conductors. Each of the openings is spaced apart from another such that the openings enable etching to form the single cavity beneath the device.

In accordance with other aspects of the invention, a monolithic integrated circuit assembly includes a substrate having a surface, a device with a length and a width and which may extend approximately the entire length of the substrate suspended above a cavity formed in a portion of the substrate, at least one sensor, at least a portion of which is suspended above the substrate and in proximity to a resistive end of the device, and circuitry on a non-suspended portion of the substrate.

The device may be a coplanar waveguide having coplanar first and second ground conductors spaced apart from one another and extending in parallel across the integrated circuit. A signal conductor receives a power signal and is coplanar with the first and second ground conductors and is located between and spaced apart from the first and second ground conductors. The signal conductor extends in parallel with the first and second ground conductors. The ground conductors terminate at resistive ends and have matching elements.

Preferably, the sensor is a thermocouple including a first junction on a non-suspended portion of the substrate, and a second junction located above the suspended portion of the substrate and in proximity to the resistive end of the coplanar waveguide.

In another embodiment of the invention, a semiconductor device includes a substrate ani openings on the surface of the substrate, each opening spaced apart from one another, forming two parallel rows extending a distance along a surface of the substrate. A device is located on the surface of the substrate.

Preferably, the device is a coplanar waveguide having a length substantially greater than a width and extends approximately the entire length of-the substrate and is suspended above a single cavity. The coplanar waveguide has coplanar first and second ground conductors spaced apart from one another extending in parallel across the integrated circuit. A signal conductor receives a power signal, is coplanar with the first and second ground conductors and is located between and spaced apart from the first and second ground conductors. The signal conductor extends in parallel with the first and second ground conductors. The ground conductors terminate at resistive ends and have matching elements.

Additional objects, advantages and novel features of this invention will be set forth in part in the description which follows, and in part, will become apparent to those skilled in the art upon examination or may be learned by practice of the invention. The objects and advantages of the invention may be realized and obtained by means of the instrumentalities and combinations particularly pointed out in the appended claims.

BRIEF DESCRIPTION OF THE DRAWINGS

The invention will be described in detail with reference to the following drawings, in which like reference numerals refer to like elements, wherein.

DETAILED DESCRIPTION OF THE INVENTION

Figure 4:
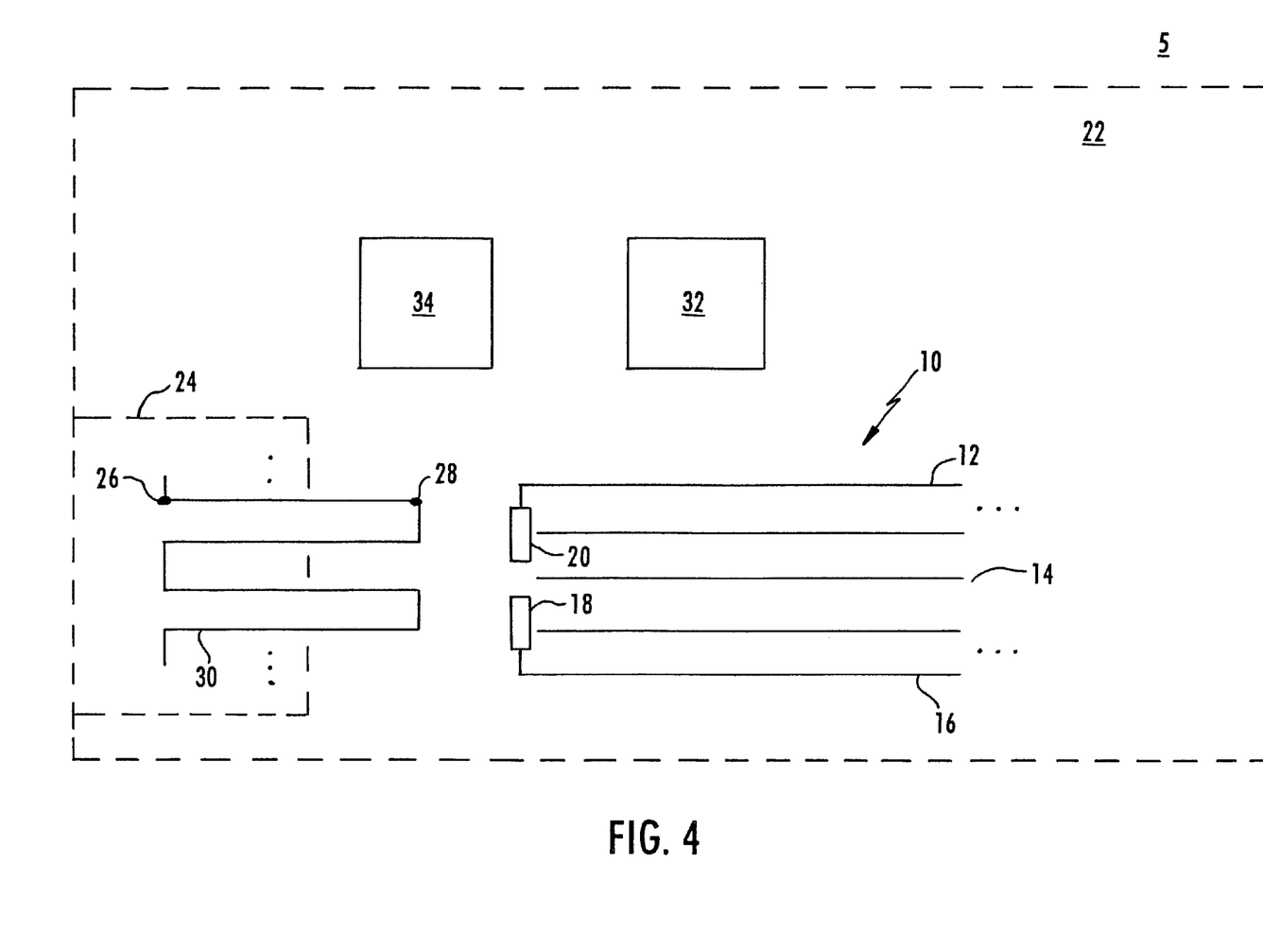
FIG. 4 is a diagram of a monolithic integrated circuit assembly comprising a high frequency device and other circuitry used in the invention.

FIG. 4 depicts an integrated circuit (IC) 5 having device 10, thermocouples 30, first circuit 32, and second circuit 34. Circuit 32 and circuit 34 may, for example, be detection and output circuitry. The device 10 is shown as a coplanar waveguide. The coplanar waveguide 10 includes a first ground conductor 12, a second ground conductor 16, and a signal conductor 14. The coplanar waveguide 10 has a length L, a width W, may extend approximately the entire length of IC 5, and is suspended above a cavity 22 within a portion of the substrate 7.

The first and second ground conductors 12 and 16 are spaced apart from one another and extend in parallel across the IC 5. The signal conductor 14 is coplanar with and located between and spaced apart from the first and second ground conductors 12 and 16. The first and second ground conductors 12 and 16, and the signal conductor 14 (collectively, transmission lines) terminate at resistive elements 18 and 20. The signal conductor 14 of device 10 provides the input connection to the resistive elements 18 and 20. The resistive elements 18 and 20 convert energy supplied by signal conductor 14 into heat energy. The resistive elements 18 and 20 form a matched resistive load, in this case, 100 ohms. The characteristic impedance of the transmission lines 12, 14, and 16 in each of the distributed arms of the device is also 100 ohms. Therefore, the net input impedance of the complete thermopile assembly (coplanar waveguide 10 and thermocouples 30) as seen by the device 10 is 50 ohms. As will be described below, the IC 5, for example, made of a silicon base material, is removed from beneath the transmission lines 12, 14, and 16 and the resistive elements 18 and 20 of the device 10 to provide the following properties. The electromagnetic effects of silicon, which cause frequency dependent transmission line impedance variation and large line losses, is removed. Secondly, relatively high thermoconductivity of the base silicon is relegated to a non-impact status removed from direct contact with the devices in order to provide thermal isolation.

Thermocouples 30 are located on IC 5. At least a portion of each of the thermocouples 30 is suspended above cavity 22, and the remaining portion of the thermocouples 30 is located above non-suspended portion 24 of IC 5. The portions of thermocouples 30 which are suspended are in proximity to the resistive elements 18 and 20, and are located a distance dl, from resistive elements 18 and 20 so as to minimize electrical coupling between thermocouples 30 and device 10. Thermocouples 30 include "cold junctions" 26, kept at an ambient temperature, and "hot junctions" 28, placed at a distance d2 away from and in proximity to the resistive elements 18 and 20, wherein d2 approximately equals d1. The hot junctions 28 are in series with the cold junctions 26 and are located above the base silicon material. To better stabilize the temperature of the cold junctions 26, the contacts of the cold junctions, made of aluminum-poly, may be covered with a second metal layer. Thermocouples 30 are connected electrically in series to provide a summation of individual thermocouple voltages formed by the aluminum-poly junctions. Therefore, thermocouples 30 are arranged as a sequence of hot and cold junctions from one end of each of the thermocouples 30 to the other end of each of the thermocouples 30. It is desirable to select the number of thermocouples 30 on the IC 5 to optimize the measurement of heat generated as a result of the power dissipation from resistive elements 18 and 20, while minimizing the noise generated by the thermocouples 30.

Measurements taken of the incoming signal from signal conductor 14 are typically short, on the order of milliseconds, due to the miniature dimensions of the device 10 and thermocouples 30, and the small thermal heat capacity of the device. However, short thermal time-constants of the device 10 allow for measurement of time-varying signals such as pulsed waveforms with enveloped frequencies up to several kilohertz. Thus, signal processing following the thermopile device 10 will provide the capability to measure peak-power levels and rms-power levels of waveform frequencies below the cutoff frequency of the device.

Figure 5:
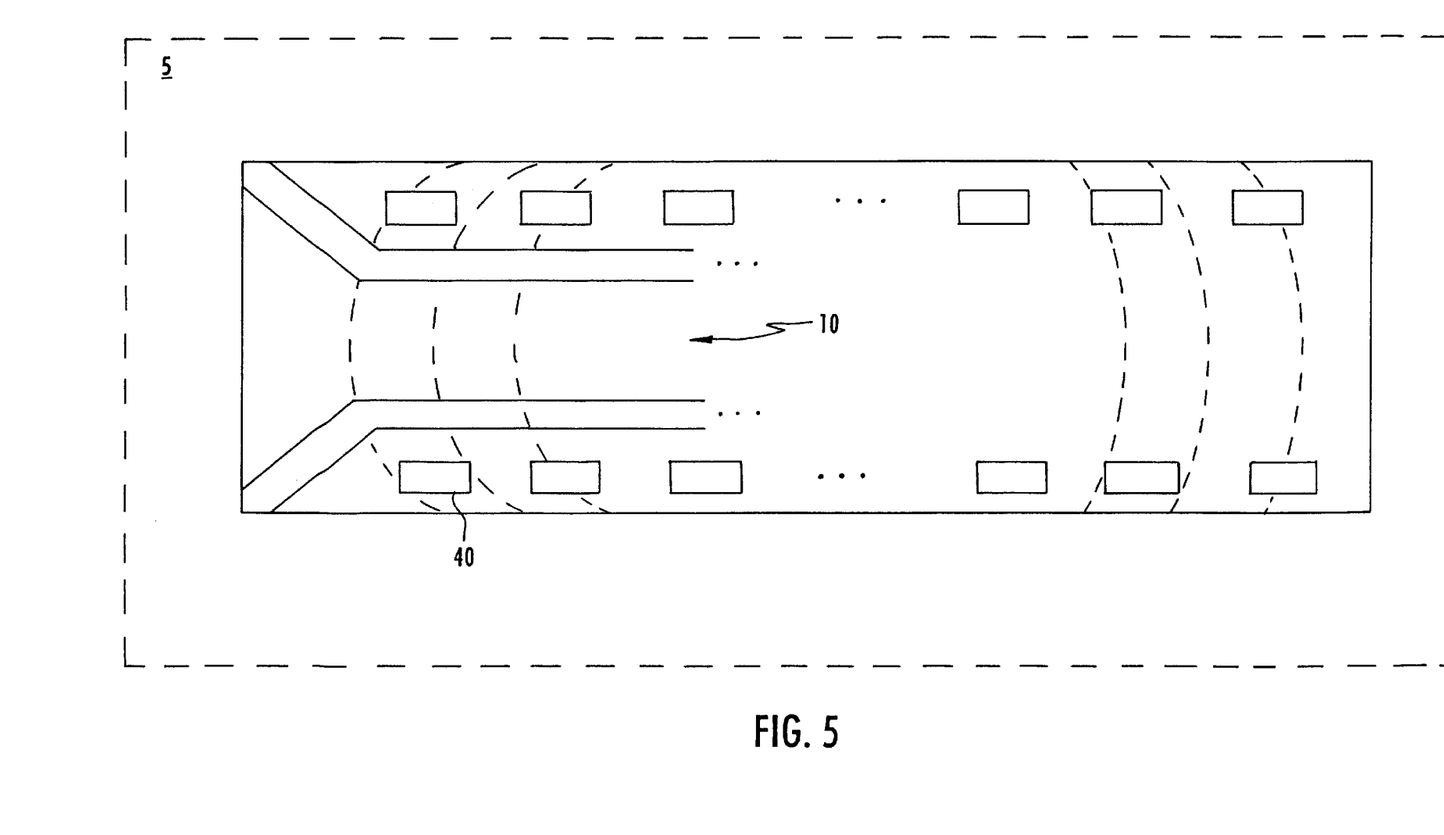
FIG. 5 is a diagram of a device extending substantially the length of a substrate which is suspended above a single cavity and supported by glass having multiple openings.

FIG. 5 illustrates a device for CMOS implementations showing the top view of the transmission lines suspended above a cavity. The device 10 is placed in a standard GSG-configuration (ground-signal-ground) across the top of the substrate 7, as illustrated in FIG. 1. The layout for the transmission lines 12, 14, and 16 is created, for example, using a standard CAD graphics layout editor, such as MAGIC. Openings 40 in the glass layer (film 42) of the IC 5 are necessary for the post-fabrication micromachining of integrated circuits. To fabricate the transmission line elements 12, 14, and 16, the openings 40 must be patterned, for example, spaced apart from one another forming two parallel rows extending a distance along the surface of substrate 7, as illustrated in FIG. 5.

The pattern of openings on the glass illustrated in FIG. 5 should only be considered exemplary, and not restrictive. The present invention also allows formation of "waffle" type patterns as well. Simply put, a waffel type pattern is a pattern that extends substantially in two dimensions in the form of a square or rectangular shape. In contrast to the pattern of openings illustrated in FIG. 5, a waffle pattern of openings would contain multiple openings extending along the x-axis, and multiple openings extending along the y-axis. The function of a waffle pattern is to allow the creation of more arbitrary film membranes.

The openings 40 in the glass layers can also be designed using the open layer in MAGIC. This enables a chemical etch to produce the desired cavity 22 under the metal strips of the transmission lines 12, 14, and 16 of device 10. This subsequently permits the etchant to penetrate from the top side of the chip and remove the substrate silicon from beneath the transmission lines 12, 14, and 16, leaving only the desired metal and the encapsulation glass.

Figure 6A:
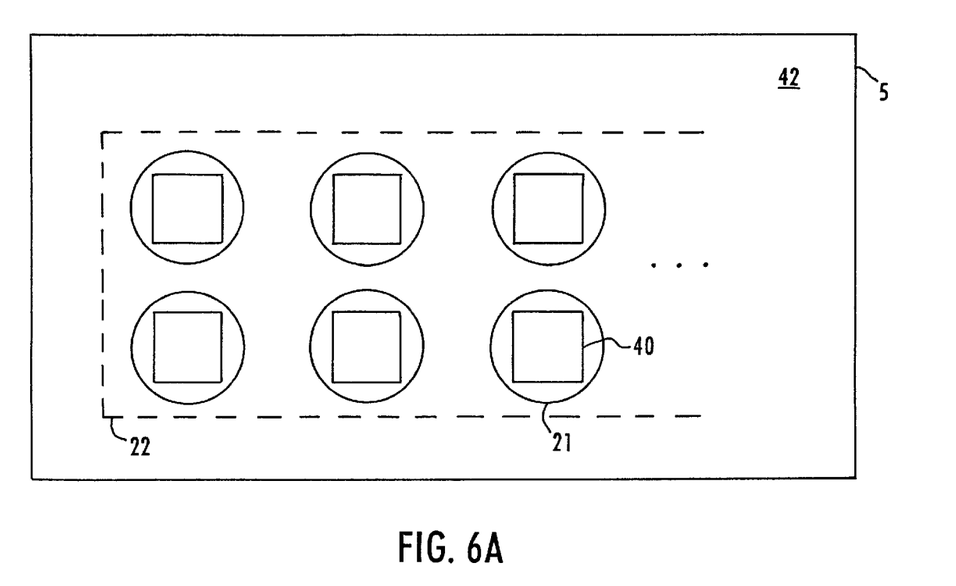
FIG. 6A is a top view of the structure illustrated in FIG. 5 after application of an isotropic etchant.
Figure 6B:
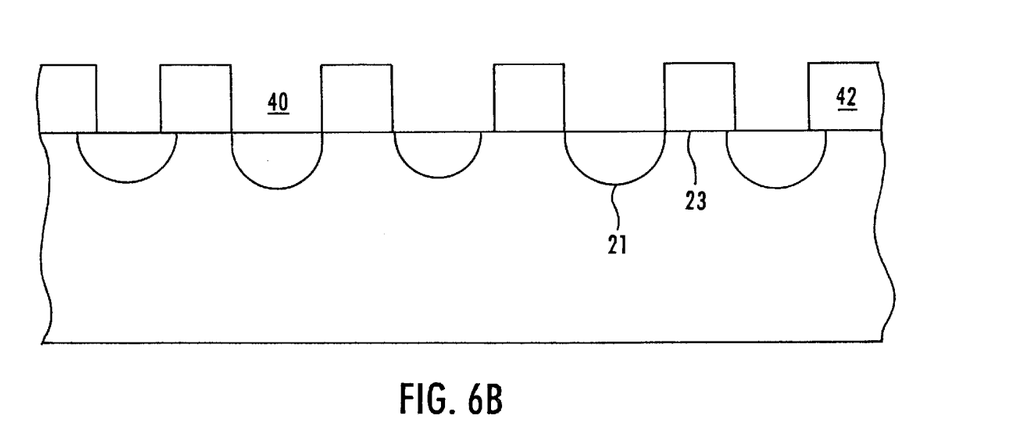
FIG. 6B is a side view of the structure illustrated in FIG. 6A after application of an isotropic etchant.

Upon completion of the fabrication process, the chips are etched in two steps, as illustrated in FIGS. 6A, 6B, 7A and 7B. FIG. 6A is a top view of the openings in the monolithic integrated circuit illustrated in FIG. 5. IC 5 includes openings 40, patterned, for example, spaced apart from one another and forming two parallel rows extending a distance along the surface of substrate 7. The openings 40 are micromachined out of thin film 42, for example a glass layer, which acts as a mask during etching except in the openings 40. In the first step, a gaseous isotropic etchant, such as xenon difluoride ($XeF_2$), is applied to IC 5, penetrating openings 40. The isotropic etch creates multiple cavities 21 around each opening 40, propagating outward radially. The isotropic etchant etches in all directions around openings 40, forming cavities 21 of equal size in all directions. Etching continues until cavities 21 begin to overlap at portions 23, illustrated in FIG. 6B, creating a gap 23 between each cavity 21, allowing gas or fluid to flow between the cavities 21. At the completion of isotropic etching, cavities 21 extend radially forming what will become the outer edges of the completed dual process etching, (isotropic and anisotropic) as depicted by dashed line 22 in FIG. 6A.

Figure 7A:
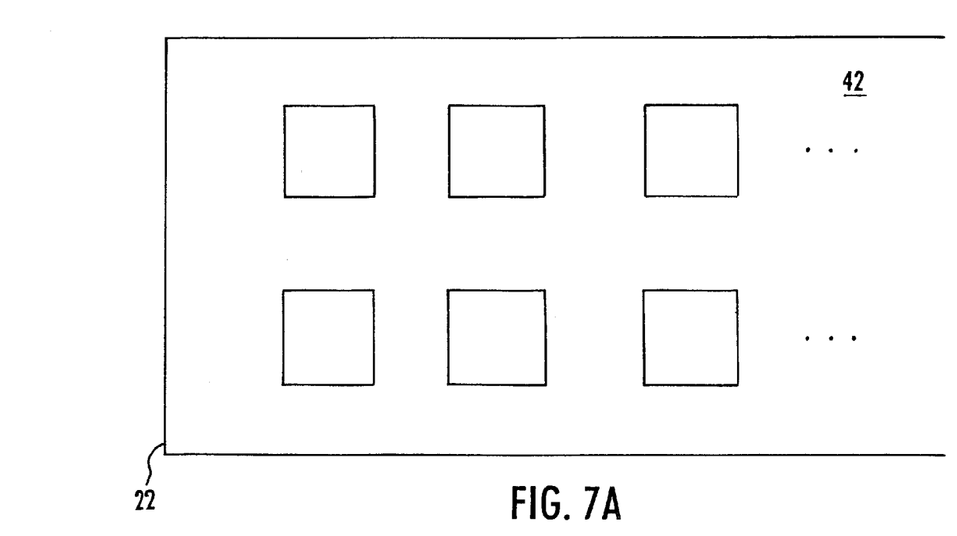
FIG. 7A is a top view of the structure illustrated in FIG. 5 after etching with an isotropic etchant and an anisotropic etchant.
Figure 7B:
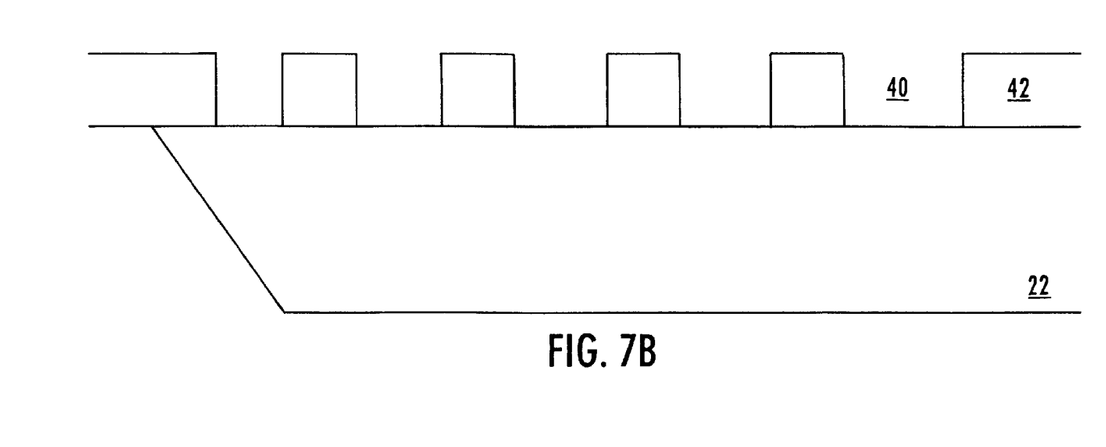
FIG. 7B is a side view of the structure illustrated in FIG. 7A after etching with an isotropic etchant and an anisotropic etchant.

In step two of the etching process, IC 5 is etched using an anisotropic etchant. FIG. 7A is a top view of the openings in the integrated circuit illustrated in FIG. 5. IC 5 includes openings 40, patterned, for example, spaced apart from one another and forming two parallel rows extending a distance along the surface of substrate 7. The openings 40 are micromachined out of thin film 42, for example a glass layer, which acts as a mask during etching except in the openings 40. In the second step, an anisotropic etchant, such as ethylene diamine-pyrocatechol-water (EDP), is applied to IC 5, penetrating openings 40 that have previously been etched with the isotropic etch. The anisotropic etch follows, for example, the crystalline structure of the <100> wafer, forming a V-shaped cavity 21. The completed walls of the etched cavity typically slope at an angle of 54.7 degrees from the surface of thin film 42 and are aligned to the <111> crystallographic plane of the substrate 7. Thus a completed cavity 22 is formed as illustrated in FIG. 7B. FIG. 7B illustrates IC 5 after completion of the isotropic and anisotropic etching processes. IC 5 includes film 42, a glass layer with openings 40, and cavity 22. Cavity 22 ends at the outer extremes of the isotropic etch, as discussed above. The depth of cavity 22 is at a distance sufficient to minimize coupling between the substrate 7 and device 10 and thermocouples 30 which are suspended above cavity 22.

Figure 8:
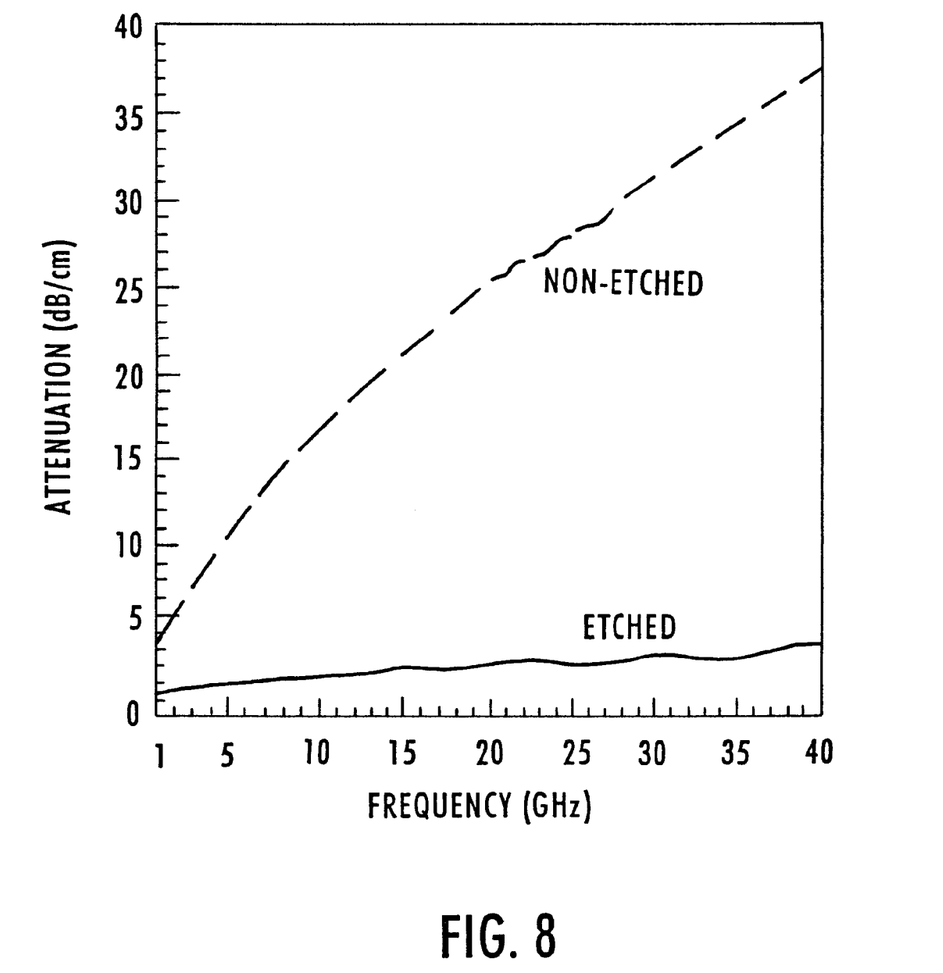
FIG. 8 illustrates insertion loss measurements of a device on an integrated circuit before and after micromachining.

FIG. 8 illustrates insertion loss measurements of a device on an integrated circuit before and after micromachining. As a result of removing (by etching using a first and second etchant) the lossy silicon substrate 7, the transmission lines 12, 14, and 16 of device 10 have significantly decreased insertion loss, and increased phase velocity, as illustrated in FIG. 8. Significantly, the measurements were obtained in the range from 1 to 40 gigahertz.

Figure 9:
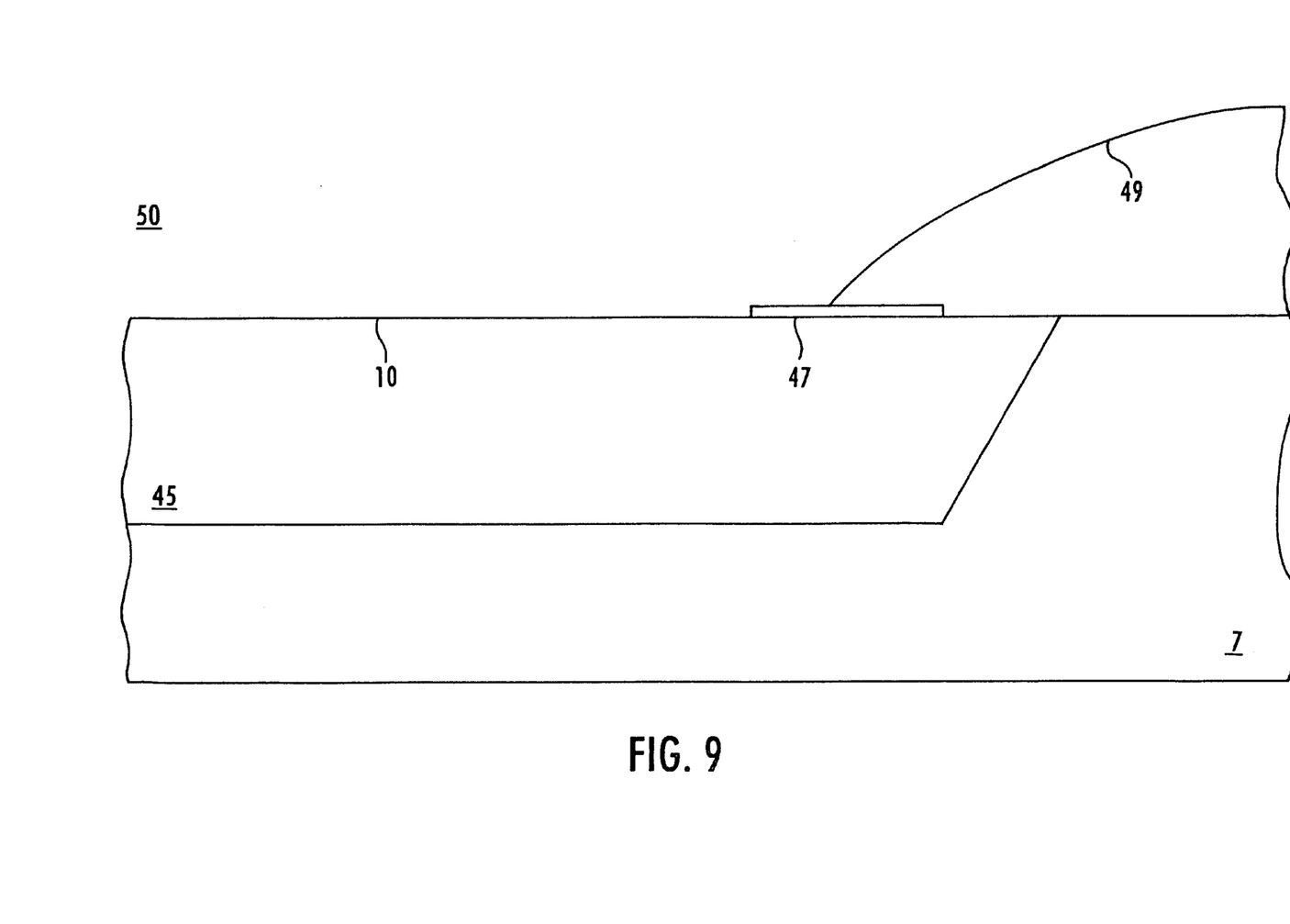
FIG. 9 is an exemplary diagram in accordance with the invention of a suspended bond pad.

FIG. 9 is an exemplary diagram of a suspended bond pad structure in accordance with the invention. The suspended bond pad structure 50 includes a bond pad 47, suspended above a cavity 45. Connected to bond pad 47 which is suspended above cavity 45 may be, for example, a bond pad connector 49. Similar to the monolithic integrated circuit (IC) 5, the suspended bond pad structure 50 may include a device 10, for example, a coplanar waveguide, thermocouples 30, first circuit 32, and second circuit 34, for example, detection and output circuitry.

The bond pad 47 is placed on top of the substrate 7, and bond connector 49 is connected to the bond pad 47 prior to etching the substrate 7. Upon completion of connecting the bond connector 49 to the bond pad 47, substrate 7 is etched to form cavity 45. The substrate 7 may be etched using a conventional technique, such as isotropic etching or anisotropic etching, or using the two-step etching process as discussed in reference to FIGS. 6A, 6B, 7A, and 7B. By etching the substrate 7 after connecting the bond connector 49 to bond pad 47, the possibility of exerting force on and breaking the bond pad structure 50 is eliminated. At the same time, however, the ability to decrease coupling between the substrate 7 and bond pad 47 is retained, and loss of the bond pad 47 is significantly decreased.

In another embodiment of the bond pad structure 50, the bond pad 47 may be placed on the substrate 7 along with, for example, device 10, for example, a coplanar waveguide, thermocouples 30, first circuit 32, and second circuit 34, for example, detection and output circuitry. In this embodiment, the substrate 7 may be etched in two steps, as illustrated in FIGS. 6A, 6B, 7A, and 7B. Thus, a single cavity 45 may be formed suspending the bond pad 47, device 10, thermocouples 30, first circuit 32, and second circuit 34. While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A method of manufacturing a low-loss microwave power sensor device, comprising the steps of:

providing a semiconductor substrate having an upper and a lower surface, said upper surface having thereon a layer of an etch-resistant material;

providing a co-planar microwave waveguide on a portion of said substrate upper surface, said co-planar waveguide including a pair of spaced-apart, elongated ground conductors and an elongated signal conductor in the space between said ground conductors and a pair of resistive elements at one end of said ground and signal conductors;

providing a thermopile assembly comprising at least a pair of thermocouple sensor elements on another portion of said substrate upper surface facing said pair of resistive elements at a spacing therefrom;

forming a pattern of spaced-apart openings in said etch-resistant layer on said substrate upper surface, said pattern defining length and width dimensions and location of a cavity to be formed within a portion of said substrate upper surface;

etching said substrate upper surface through said openings in said etch-resistant layer with a first etchant to form a plurality of partial cavities therein, each having dimensions less than said length and width dimensions;

and etching said substrate upper surface through said openings in said etch-resistant layer with a second etchant to complete formation of said cavity, wherein the dimensions and substrate portion of said cavity are selected such that said cavity is positioned beneath said elongated ground and signal conductors of said waveguide and beneath the portion of said thermopile assembly in spaced adjacency to said resistive elements of said waveguide, whereby the resistive elements of said waveguide and said thermocouple sensor elements of said thermopile assembly overhang said cavity in spaced adjacency.

2. The method according to claim 1, wherein the etching of said cavity using the first and second etchants includes etching the top surface portion of the substrate from directly beneath the waveguide and thermopile assembly after providing each on said substrate portions.

3. The method according to claim 1, wherein said first etchant is an isotropic etchant and said second etchant is an anisotropic etchant.

4. The method according to claim 3, wherein said semiconductor substrate comprises silicon, said first, isotropic etchant comprises xenon difluoride ($XeF_2$), and said second, anisotropic etchant comprises ethylenediamine-pyrocatechol-water.

5. The method according to claim 4, further comprising providing detection and output circuitry on yet another portion of said substrate upper surface.

6. The method according to claim 1, comprising providing said pattern of openings in said etch-resistant layer in parallel with the length and width dimensions of said ground and signal conductors of said waveguide.

* * * * *